(12) United States Patent
Chan et al.

(10) Patent No.: US 6,191,665 B1
(45) Date of Patent: Feb. 20, 2001

(54) COUPLING CIRCUIT TO REDUCE INTERMODULATION DISTORTION IN RADIOFREQUENCY RECEIVERS

(75) Inventors: Sek Loon Chan, Penang; Sin Hooi Cheah, Butterworth, both of (MY)

(73) Assignee: Motorola, Inc., Schaumburg, IL (US)

( * ) Notice: Under 35 U.S.C. 154(b), the term of this patent shall be extended for 0 days.

(21) Appl. No.: 09/310,714

(22) Filed: May 12, 1999

(30) Foreign Application Priority Data

May 29, 1998 (MY) .................................................. 9802390

(51) Int. Cl.[7] ...................................................... H03H 7/06
(52) U.S. Cl. ........................................... 333/175; 333/81 R
(58) Field of Search ..................................... 333/167, 172, 333/175, 81 R

(56) References Cited

U.S. PATENT DOCUMENTS

| | | | |
|---|---|---|---|
| 3,868,604 | * | 2/1975 | Tongue ................................ 333/28 R |
| 5,187,457 | * | 2/1993 | Chawla et al. ........................ 333/170 |
| 5,796,286 | * | 8/1998 | Otaka ................................... 327/308 |

OTHER PUBLICATIONS

Ross, Richard A. "CQ Reviews: The Healthkit SB–104 SSB/CW Transceiver Kit" Aug., 1975 Radio Almanac (USA), vol. 31, No. 8, pp 28–32 & 68–73.*

* cited by examiner

Primary Examiner—Justin P. Bettendorf
(74) Attorney, Agent, or Firm—Barbara R. Doutre

(57) ABSTRACT

A coupling circuit (22) for a radiofrequency (RF) receiver (10) has an attenuator (38) and a resonator (40). Three resistors (42,44,46) of attenuator (38) provide a lossy resistive isolation between a first mixer (20) and a crystal filter (24) of (RF) receiver (10) for undesired signals such as noise and harmonics. Thus, signal reflections between first mixer (20) and crystal filter (24) are absorbed for these undesired signals. However, for desired signals at an intermediate frequency (IF), resonator (40) has an inductor (54) and a capacitor (56) to resonate with such desired signals at the IF. As a result of resonance, resistors (42,46) are isolated to alleviate attenuation of the desired signals.

6 Claims, 1 Drawing Sheet

COUPLING CIRCUIT TO REDUCE INTERMODULATION DISTORTION IN RADIOFREQUENCY RECEIVERS

FIELD OF THE INVENTION

This invention relates to radiofrequency (RF) receivers of communication devices. In particular, this invention relates to, but is not necessarily limited to, a coupling circuit to improve intermodulation in such receivers.

BACKGROUND OF THE INVENTION

In radiofrequency (RF) receivers of communication devices, a carrier signal is typically received via an antenna and then processed by circuitry to obtain a lower frequency baseband signal. Such circuitry have different circuit stages or circuit elements to process the carrier signal. Processing the carrier signal includes amplification, mixing to convert the carrier signal to the baseband signal and filtering of noise or undesired harmonics resulting from the amplication or the mixing.

Performance of the stages or elements can be characterised with parameters such as, for example, a second or a third order intercept point (IP2&IP3). IP2 and IP3 indicates how well such stages or elements perform in the presence of strong nearby signals including noise and undesired harmonics. Such nearby signals cause intermodulation distortion, which affects desired signals that are processed by the stages or elements. In a communication device such as, for example, a two way radio, an overall or system IP2 or IP3 of the (RF) receiver within the two way radio can be degraded by the IP3 of an individual stage or element. One technique to overcome or alleviate degradation of the system IP2 or IP3 is to couple the stages or elements of the (RF) receiver with low impedance stages. Hence, as a low impedance stage, a diplexer typically couples a mixer to a crystal filter in conventional (RF) receivers. Such a diplexer preceeds the crystal filter to thereby provide a low impedance load for the mixer.

However, diplexers do not provide a complete solution to the degradation of the system IP2 or IP3 of (RF) receivers. This is because different types of mixers or crystal filters require different circuitry to be configured for the diplexers. Furthermore, diplexers can be complex and require many discrete elements which, therefore, increase the cost of (RF) receivers.

SUMMARY OF THE INVENTION

It is an object of this invention to overcome or at least alleviate at least one of the problems associated with coupling of signals between circuit stages or elements of (RF) receivers of communication devices.

According to one aspect of the invention, there is provided a coupling circuit for coupling a frequency signal between circuit stages, said coupling circuit comprising:
  a resonator having at least two impedance elements; and
  an attenuator having at least two resistors, said attenuator being connected to said circuit stages and said resonator;
  wherein, when said resonator resonates with said frequency signal, at least one of said resistors is isolated from said circuit stages to thereby alleviate attenuation of said frequency signal between said circuit stages.

Preferably, said attenuator can be a pi-network formed with said resistors.

Alternatively, said attenuator can be a tee-network formed with said resistors.

Suitably, said impedance elements can comprise at least one capacitor and at least one inductor, said impedance elements being connected in parallel relative to each other.

Preferably, said circuit stages can include a mixer.

Suitably, said circuit stages can include a crystal filter.

According to another aspect of the invention, there is provided a coupling circuit comprising:
  an attenuator having at least two resistors, said attenuator being connected to circuit stages, said circuit stages being configured to process a frequency signal; and
  a resonator having at least two impedance elements, said impedance elements being connected in parallel relative to each other,
  wherein, when said resonator resonates with said frequency signal, at least one of said resistors is isolated from said circuit stages to thereby alleviate attenuation of said frequency signal between said circuit stages.

Preferably, said attenuator can be a pi-network formed with said resistors.

Alternatively, said attenuator can be a tee-network formed with said resistors.

Suitably, said impedance elements can comprise at least one capacitor and at least one inductor.

Preferably, said circuit stages can include a mixer.

Suitably, said circuit stages can include a crystal filter.

BRIEF DESCRIPTION OF THE DRAWINGS

In order to describe the invention and to put it into practical effect, reference will now be made to a preferred embodiment as illustrated with reference to the accompanying drawings in which.

DETAILED DESCRIPTION OF THE INVENTION

Reference will now be made to the FIGs. accompanying this specification to illustrate a preferred embodiment in accordance with the invention.

Figure 1:
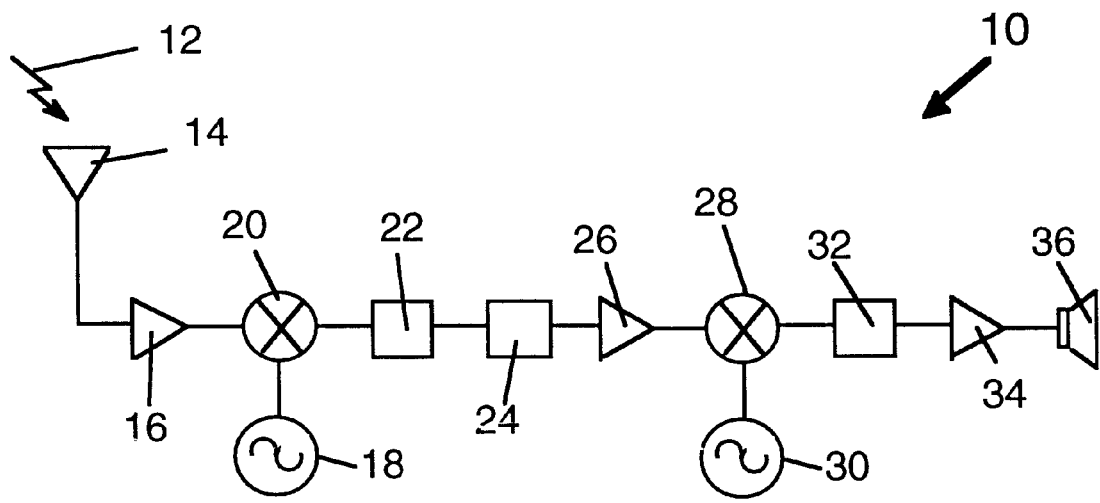
FIG. 1 is a block diagram of a radiofrequency receiver in accordance with the invention.

FIG. 1 is a block diagram of a radiofrequency (RF) receiver 10. Rf receiver 10 receives a carrier signal 12 via an antenna 14. The carrier signal is amplified by (RF) amplifier 16 and then mixed with a first oscillating signal from a first local oscillator 18 within a first mixer 20. Output from first mixer 20 is an intermediate frequency (IF) signal which is then coupled through a coupling circuit 22 to a crystal filter 24. Upon filtering, the IF signal is provided to an IF amplifier 26. Subsequently, the IF signal is mixed at a second mixer 28 with a second oscillating signal from a second local oscillator 30 to obtain a baseband signal. The baseband signal is then demodulated by detector 32 to obtain an audio signal. The audio signal is amplified with an audio amplifier 34 coupled to an audio transducer 36.

Figure 2:
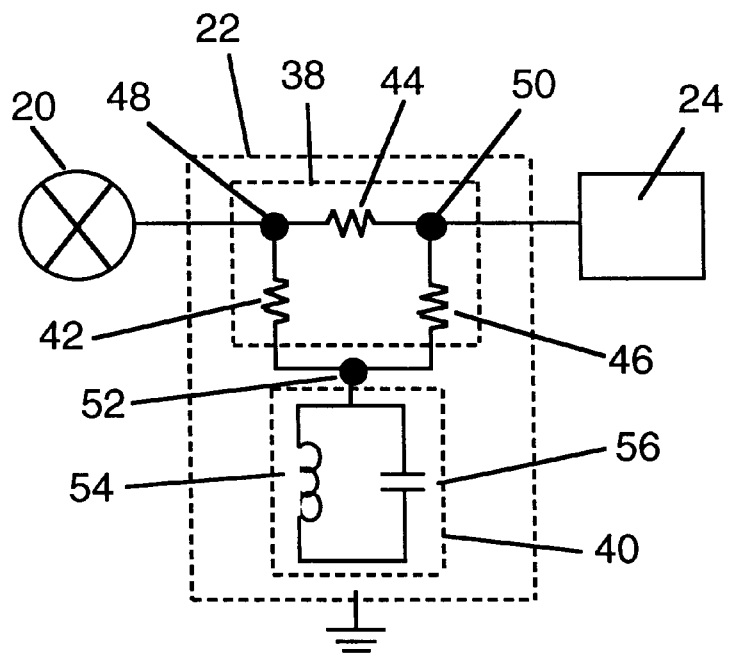
FIG. 2 is a schematic diagram of a coupling circuit within the radiofrequency receiver of FIG. 1.

Coupling circuit 22 is schematically shown with more details in FIG. 2. Coupling circuit 22 comprises an attenuator 38 and a resonator 40. Attenuator 38 has three resistors 42, 44, 46 forming a pi-network and connects to two circuit stages, namely first mixer 20 and crystal filter 24 via nodes 48 and 50 respectively. Attenuator 38 connects to resonator 40 at a third node 52. Resonator 40 has an inductor 54 and a capacitor 56 connected in parallel relative to each other.

Although a pi-network of resistors 42, 44, 46 is described in this preferred embodiment for attenuator 38, it is to be noted that a tee-network of resistors 42, 44, 46 can also be configured to connect to first mixer 20, crystal filter 24 and resonator 40.

In operation, values of inductor 54 and capacitor 56 are selected to resonate at the frequency of the IF, signal or IF. When resonating with the IF signal at the IF, resistors 42, 46 are isolated from first mixer 20 and crystal filter 24. As a result of isolating resistors 42, 46, attenuation of the IF signal across attenuator 38 is alleviated. At frequencies away from the IF, attenuator 38 has lossy resistive isolation between first mixer 20 and crystal filter 24. Furthermore, coupling circuit 22 provides a low impedance termination of circuitry associated with first mixer 20 and crystal filter 24. Hence, signal reflections between first mixer 20 and crystal filter 24 are absorbed by attenuator 38 at frequencies away from the IF. With appropriate values selected for resistors 42, 44, 46, the loss in the IF signal occurs mainly across resistor 44 and can be one decibel or less.

Advantageously, coupling circuit 22 attenuates undesired signals more than desired signals at the IF. The lossy resistive isolation for such frequencies and the low impedance termination for first mixer 20 and crystal filter 24 improves intermodulation (IM) distortion for (RF) receiver 10. This is unlike conventional (RF) receivers having diplexers that just provide termination for undesired signals and does not attenuate such signals. A further advantage is that coupling circuit 22 is simple and has less components than conventional diplexers and this reduces the cost of (RF) receiver 10.

Although the invention has been described with reference to a preferred embodiment, it is to be understood that the invention is not restricted to the preferred embodiment described herein.

We claim:

1. A coupling circuit for coupling a frequency signal between circuit stages, said coupling circuit comprising:

a resonator having at least two impedance elements; and an attenuator having at least two resistors, said attenuator being connected to said circuit stages and said resonator;

wherein, when said resonator resonates with said frequency signal, at least one of said resistors is isolated from said circuit stages to thereby alleviate attenuation of said frequency signal between said circuit stages, and when not at resonance an output phase current from said coupling circuit is in phase with an input current to said coupling circuit.

2. The coupling circuit as claimed in claim 1 wherein said attenuator is a pi-network formed with said resistors.

3. The coupling circuit as claimed in claim 1 wherein said attenuator is a tee-network formed with said resistors.

4. The coupling circuit as claimed in claim 1 wherein said impedance elements comprise at least one capacitor and at least one inductor, said impedance elements being connected in parallel relative to each other.

5. The coupling circuit as claimed in claim 1 wherein said circuit stages includes a mixer.

6. The coupling circuit as claimed in claim 1 wherein said circuit stages includes a crystal filter.

* * * * *